(12) United States Patent
Kirsch et al.

(10) Patent No.: US 6,473,727 B1
(45) Date of Patent: Oct. 29, 2002

(54) PROCESSOR DEVELOPMENT SYSTEMS

(75) Inventors: Graham Kirsch, Tadley (GB); Kershaw Martin Simon, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/262,817

(22) Filed: Mar. 5, 1999

(30) Foreign Application Priority Data

Mar. 6, 1998 (GB) .............................................. 9804910
Jun. 10, 1998 (GB) .............................................. 9812512

(51) Int. Cl.[7] .......................... G06F 9/455; G01R 31/28
(52) U.S. Cl. ......................... 703/28; 714/733; 714/727; 714/726; 714/30
(58) Field of Search ........................ 703/28, 21; 714/30, 714/726, 727, 733, 734, 728

(56) References Cited

U.S. PATENT DOCUMENTS

| | | | | |
|---|---|---|---|---|
| 5,153,882 A | * | 10/1992 | Lyon et al. .................. 714/726 |
| 5,224,101 A | * | 6/1993 | Popyack, Jr. ................ 714/718 |
| 5,325,367 A | * | 6/1994 | Dekker et al. ............... 714/733 |
| 5,329,471 A | * | 7/1994 | Swoboda et al. ............. 714/28 |
| 5,347,523 A | * | 9/1994 | Khatri et al. ................ 714/730 |
| 5,515,382 A | * | 5/1996 | Lassorie ...................... 714/730 |
| 5,515,530 A | * | 5/1996 | Eskandari .................... 714/733 |
| 5,551,050 A | * | 8/1996 | Ehlig et al. ................... 703/28 |
| 5,553,249 A | * | 9/1996 | Datwyler et al. ........... 710/128 |
| 5,581,564 A | * | 12/1996 | Miller et al. ................ 714/726 |
| 5,592,493 A | * | 1/1997 | Crouch et al. .............. 714/733 |
| 5,596,734 A | * | 1/1997 | Ferra ...................... 712/205 X |
| 5,661,732 A | * | 8/1997 | Lo et al. ..................... 714/733 |
| 5,867,507 A | * | 2/1999 | Beebe et al. ................ 714/726 |
| 5,995,993 A | * | 11/1999 | Liang ........................ 708/525 |
| 6,055,656 A | * | 4/2000 | Wilson, Jr. et al. ......... 714/724 |
| 6,088,823 A | * | 7/2000 | Ayres et al. ................ 714/733 |

FOREIGN PATENT DOCUMENTS

EP 0 854422 7/1998

* cited by examiner

Primary Examiner—Hugh M. Jones
Assistant Examiner—W. D. Thomson
(74) Attorney, Agent, or Firm—Conley, Rose & Tayon

(57) ABSTRACT

A processor including in-circuit emulation means comprising a plurality of scan chains of serially connected registers coupled to a means for enabling a serial scan procedure to be carried out, a first scan chain including an address register for providing an address on an address bus to memory, and means for incrementing the value in the address register under control of the processor, the scan chains being arranged to control the processor for incrementing the address register, and the scan chains including a data register coupled to the data bus of the memory to read/write data.

8 Claims, 2 Drawing Sheets

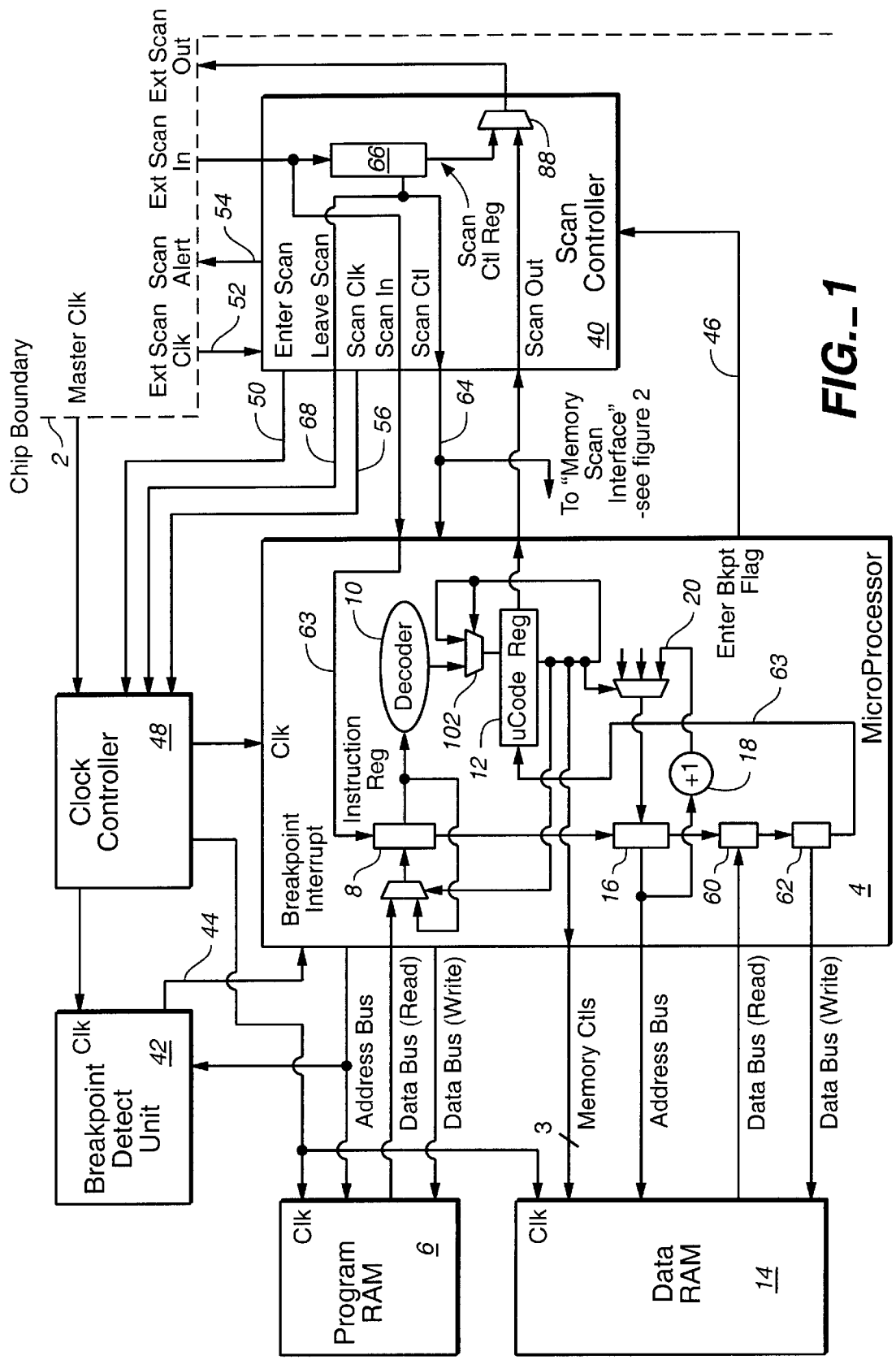
FIG._1

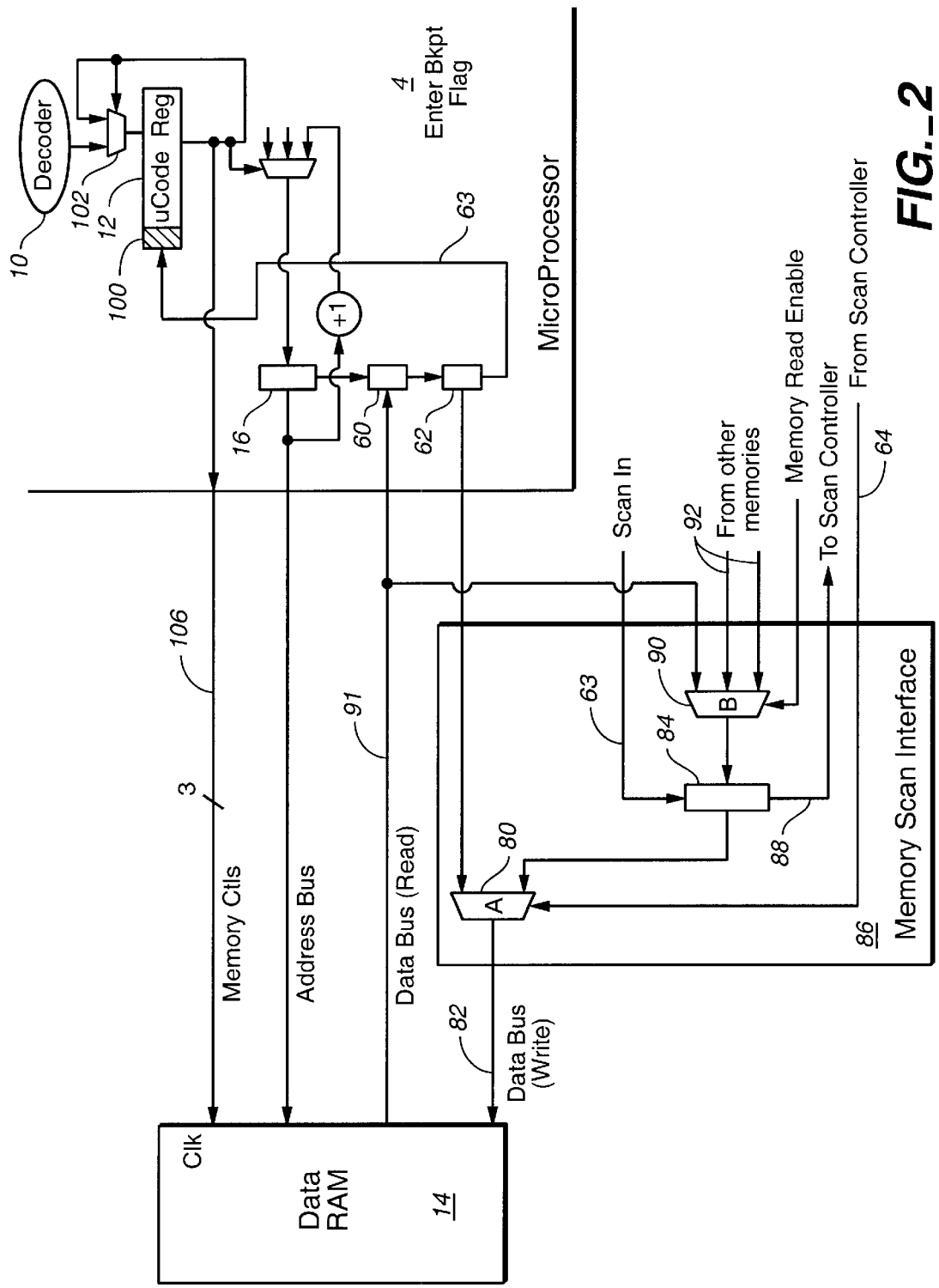

PROCESSOR DEVELOPMENT SYSTEMS

The present invention relates to a method and apparatus for carrying out debugging procedures on a processor, for example a microprocessor, Digital Signal Processing (DSP) processor, or programmable ASIC core.

Software debugging is commonly carried out using In Circuit Emulation (ICE) wherein a monitor program located in the microprocessor provides information to an external host.

It has been recognised that software debugging using ICE techniques may be carried out more expeditiously using techniques adapted from production testing of microprocessor with production scan-chains. Such production scan chains are to be distinguished from boundary scan registers as in the known JTAG standards. In production scan chains, registers are provided through the processor so that the working of a software routine through the processor can be observed, i.e. it is "visible". For production testing the production scan chain of registers can be loaded with a random pattern of logic values. One or more machine cycles may then be executed, and the logic values are fed into the microprocessor logic. The resultant logic values in the registers may then be uploaded and examined to assess whether the microprocessor logic is working correctly.

A scan module coupled to an ASIC core is commonly used to detect an appropriate time to halt the core's operation, so that off-chip external host can both examine and alter the core's state under the control of user. This is achieved by stopping the system clock, scanning-out the state of the core, modifying the register values in the off-chip host and finally scanning the new state back in. The method essentially gives full observability and controllability of the core by serially accessing every flip-flop in the design.

A key requirement of an embedded debug system for a microprocessor core is to provide access to system memory. It is not commercially viable to make a significant block of memory scannable, so an alternative approach must be found. A known approach to accessing synchronous SRAM for embedded debug purposes makes use of a "monitor" program actually running on the core (target processor). On reaching an appropriate breakpoint, the monitor code is executed and memory values are transferred to and from the core in real time via a memory-mapped mailbox, implemented as a dual-port RAM. It is usual for a software-driven handshaking protocol to be used to control the operation. On completion of the debugger activities, the monitor program is exited and control passes back to the breakpointed program.

The disadvantages with this approach are: firstly, the "monitor" program consumes some significant area of memory in the processor that either raises cost in production devices or means production devices are implemented without debug circuitry. Secondly, the interface between the microprocessor and the mailbox is typically implemented as a parallel bus consuming a considerable number of pins and again raising costs. Thirdly, the only registers "visible" to the off-chip debug circuitry are those that can be accessed by actual processor instructions (located in the "monitor" program), i.e. those that form part of the programming model, and therefore a complete picture of the processor is not given.

SUMMARY OF THE INVENTION

It is an object of the invention to provide a processor development system which can access memory without creating undue demands on memory and creating undue delays.

Accordingly, the present invention provides in a first aspect a processor including in-circuit emulation means comprising a plurality of scan-chains of serially connected registers coupled to a means for enabling a serial scan procedure to be carried out, a first scan-chain including an address register for providing an address on an address bus to memory, and means for incrementing the value in the address register under the control of the processor, the scan-chains being arranged to control the processor for incrementing the address register, and the scan-chains including a data register coupled to the data bus of the memory to read/write data.

In a second aspect, the invention provides a method of in-circuit emulation for a processor comprising:

1) providing in the processor, a plurality of scan-chains of serially connected registers, a first scan-chain including an address register for providing an address to memory, and one of said chains including a processor control register for the controlling of the address register 2) incrementing the contents of the address register a predetermined amount under control of the processor control register; and 3) reading or writing data for the address locations in a data register located in the scan chains.

BRIEF DESCRIPTION OF THE DRAWINGS

A preferred embodiment of the invention will now be described with reference to the accompanying drawings in which:

FIG. 1 is a block diagram of the processor according to the invention;

FIG. 2 is a more detailed block diagram of features of memory access of the present invention; and

DESCRIPTION OF THE PREFERRED EMBODIMENT

This invention provides observability and controllability of the microprocessors' state, via it production scan-chain. The technique relies on the state of the microprocessor being held in scannable flip-flops at all times. These flip-flops are typically connected in a serial chain to allow testing of production parts; test-vectors are scanned into the device, the device is clocked in its functional mode and the resulting data is scanned back out. If the vectors match expected results, the part is good. The alternative use of this production scan-chain for in-circuit emulation is illustrated in FIG. 1.

It is a simplified illustration of the on-chip component parts (the chip boundary being indicated at 2) of a microprocessor 4 with support for in-circuit emulation comprising a scan controller unit 40 and a breakpoint detect unit 42. The microprocessor processes by first loading instructions from Program RAM 6 into its instruction register 8. These are decoded in a decoder 10 and the set of control signal produced (the "microcode word") are registered in the microcode register 12. The outputs of the microcode register 12 control the operation of the microprocessor by configuring multiplexers and other logic in the circuit. An example operation might be the accessing of a block of data memory. A register 16 is initialised with the first address of the block, and then on successive clock cycles, the memory is accessed, control being handled by bits of the microcode register 12 driving the memory's control signals. The presence of an incrementer 18 and feedback path 20 around the register 16 permits the address supplied to the memory to be updated simultaneously with the memory access.

In use, at some point during program flow, the breakpoint detect unit 42 detects a condition at which the user wishes to interrogate/update the microprocessor's state; this could be an address appearing on the program address lines. The breakpoint detect unit 42 raises a "Breakpoint Interrupt" on line 44 to interrupt program flow and force execution from the "Breakpoint Interrupt Service Vector". The instructions at the "Breakpoint Interrupt Service Vector" might simply be "No-Operations" to clear the microprocessor's pipeline. When the microprocessor starts executing the "No-Operation" instructions, it raises an Enter Bkpt Flag at 46 to signal to the scan controller 40 that the microprocessor 4 should be halted in preparation for a debug operation. The scan controller 40 in turn signals a clock controller 48 via Enter Scan control line 50 to cleanly switch the clock source from a free-running Master clock to an off-chip controllable Scan Clock 52. A Scan Alert signal on line 54 to off-chip debug circuitry is asserted to indicate the system is ready for debug operations.

An external host (not shown) can control the on-chip clocks via Ext Scan Clk on line 52 and Scan Clk on line 56, it can configure registers 8, 16, 66, 62, 12 into a serial scan-chain 63 and shift data in and out of the device. In this way the state of the microprocessor can be interrogated and updated. Control of the register's function occurs by means of Scan Ctl inputs on line 64 to the microprocessor that are driven from a serially loadable Scan Ctl register 66 in the Scan Controller 40. When the debug function has completed, a control sequence is shifted into the Scan Ctl register 66 to force the assertion of Leave Scan 68 and trigger the Clock Controller 48 into switching the microprocessor's clock from the Scan Clk on line 52 to the free-running "Master Clk", and normal operation is resumed. Before completing the debug function, the off-chip host must ensure that the instruction register 8 in the microprocessor has been loaded (via the scan-chain) with a "Return-from-Interrupt" instruction to ensure the "Breakpoint Interrupt" entered at the start of the sequence is completed correctly.

The process described above is acceptable for accessing the microprocessor's on-core resources, but provides no practical way of accessing memory. This can be achieved by adding some circuitry between the microprocessor and memory to capture and supply data, and make use of the microprocessor itself to supply addresses. The modified circuit is illustrated in FIG. 2.

Under normal operation, the scan controller 40 configures multiplexer 80 in a memory scan interface 86 to simply pass the microprocessor's data output bus 82 through to the memory 14, the only impact being the small performance penalty of having the multiplexer in the data path. During debug operation, the scan controller 40 can configure the multiplexer 80 to route the parallel output of a register 84 in the memory scan interface 86 to the memory. This register has its own scan-chain 88 that can be used to serially load or read the register, independently of the microprocessor's operation, via the scan controller 40. The parallel input to this register is driven from a multiplexer 90 that combines the memory read data bus 91 with all other memory data-output buses 92 in the system; the control of this multiplexer is simply derived from the individual memory read-enables.

A feature of the system illustrated in FIG. 2 is that the microprocessor is used to supply the memory address for a memory access. This is achieved by first loading the address register 16 with a desired value via a microprocessor core full-scan, and simultaneously forcing values in the microcode register 12 to make use of a feature common on microprocessors known as "address incrementation". Now, every time the microprocessor is clocked, the address register 16 is incremented, providing an efficient mechanism for accessing a block memory. For this scheme to work, there is a requirement that microcode register 12 does not load a new micro instruction from the decoder 10. This can be achieved by dedicating a bit 100 in the microcode register to driving an input multiplexer 102 between the decoder 10 and register 12. Under normal operation this bit might typically never be toggled (since this would potentially cause "lock-up") but the bit can be programmed via a serial scan to provide just the control needed here.

There are two key advantages in using the microprocessor to supply addresses:

All the usual decoding (inside or outside the microprocessor) is used to control which memory is accessed; this same control circuitry configures multiplexer 90 in FIG. 2 to select the correct data-bus 92 when reading from memory;

There is no performance impact in placing circuitry in the address path from the microprocessor, which is typically a critical path;

Thus, for access to synchronous memory 14 during debug, for a memory read:

The address for the read is loaded serially in scan chain 63 from the host;

The microprocessor is configured via a full scan to read from memory. The initial address is loaded into the address register 16 and the microcode register 12 is configured to route this value to the correct bus, auto-increment register 16, drive appropriate memory controls on line 106 and prevent itself from reloading by controlling multiplexer 102;

The Scan Controller 40 ensures on the next clock edge there is clocked the microprocessor core 4 (and hence memory 14) the memory data is output on bus 91, the address register 16 is updated, and register 84 in memory scan interface 84 is clocked;

The data on bus 91 is registered in register 84 on the next clock pulse;

The scan controller 40 serially scans out the read data from the register 84 in the Memory Scan Interface 86. This data is serially passed back to the host for communication to the user.

For a memory write:

The data and address for the write are serially loaded from the off-chip circuitry;

The microprocessor 4 is configured via a full scan to write to memory. The initial address is loaded into the address register 16 and the microcode register 12 is configured to route this value to the correct bus, auto-increment register 16, drive appropriate memory controls on line 106 and prevent itself from reloading by control of multiplexer 102;

The scan controller 40 loads the new data serially into the register 84 in the memory scan interface 86, configures multiplexer 80 in the Memory Scan Interface 86 to route this data to the memory data bus and ensures the microprocessor (and hence memory) is clocked on the next clock edge to implement the memory write and update the address register;

A clock is applied to implement the memory write.

Following first memory access, provided subsequent addresses for access is sequentially determined by the features of the microprocessor for address auto-updating and no further full-scans of the microprocessor are necessary. Only the register 84 in the Memory Scan Interface in its own (much smaller) scan-chain requires updating.

A key advantage of the memory access scheme described here is that it makes memory access through debug practicable by minimising the number of operations needed for each access. This in turn makes the method a viable solution for in-circuit software debug, thus providing advantages over conventional methods in that no memory is dedicated to a monitor program, a naturally serial interface is provided and access to ALL system registers is provided, not just those that are program visible. Further, the use of microprocessor's resources for address generation reduces the circuit overhead of implementation and minimises the performance impact.

What is claimed is:

1. A processor comprising:

a memory;

an address register coupled to said memory; and an in-circuit emulation subsystem coupled to said memory, said in-circuit emulation subsystem including:

a plurality of scan chains each including a plurality of serially connected registers, wherein each or said plurality of scan chains is coupled to a scan input connection and a scan output connection; and a memory scan interface including a data register, wherein said data register is coupled to a first one of said plurality of scan-chains and configured to receive read data from said memory via a read data bus in response to activation of a system clock and to serially unload said read data via said first one of said plurality of scan-chains in response to activation of a scan clock;

wherein said address register is further coupled to a second one of said plurality of scan-chains and configured to be serially loaded with an address value of a location in said memory, wherein said address register is configured to increment said address value in response to activation of said system clock;

a microcode register coupled to be serially loaded with a microcode instruction via said second one of said plurality of scan-chains and configured to provide memory control signals in response to said microcode instruction being serially loaded; and a decode multiplexer coupled to said microcode register and configured to prevent disruption of the contents of said microcode register.

2. The processor as recited in claim 1, wherein said in-circuit emulation subsystem further includes a scan control unit coupled to a given one of said plurality of scan chains and configured to provide scan control signals in response to a given value being serially loaded via said given one of said plurality of scan chains.

3. The processor as recited in claim 1, wherein said data register is further configured to be serially loaded with write data via said first one of said plurality of scan-chains in response to activation of said scan clock.

4. The processor as recited in claim 3, wherein memory scan interface is further configured to provide said write data to said memory via a write data bus in response to activation of said system clock.

5. The processor as recited in claim 1, wherein said microcode instruction is a memory read.

6. The processor as recited in claim 1, wherein said microcode instruction is a memory write.

7. The processor as recited in claim 1, wherein said microcode register includes a bit used to selectively control said decode multiplexer.

8. The processor as recited in claim 1, wherein said plurality of serially connected registers are functional registers during activation of a system clock and scan registers during activation of a scan clock.

* * * * *